United States Patent
Kaanta et al.

(10) Patent No.: US 10,131,538 B2
(45) Date of Patent: Nov. 20, 2018

(54) MECHANICALLY ISOLATED MEMS DEVICE

(71) Applicant: Analog Devices, Inc., Norwood, MA (US)

(72) Inventors: Bradley C. Kaanta, Belmont, MA (US); Kemiao Jia, Tolland, CT (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/853,251

(22) Filed: Sep. 14, 2015

(65) Prior Publication Data

US 2017/0073218 A1 Mar. 16, 2017

(51) Int. Cl.
*H01L 29/84* (2006.01)
*B81B 7/00* (2006.01)

(52) U.S. Cl.
CPC .... *B81B 7/0048* (2013.01); *B81B 2203/0163* (2013.01)

(58) Field of Classification Search
None
See application file for complete search history.

(56) References Cited

U.S. PATENT DOCUMENTS

| | | | |
|---|---|---|---|
| 3,839,660 A | 10/1974 | Stryker | 357/67 |
| 4,492,825 A | 1/1985 | Brzezinski et al. | 179/111 |
| 4,524,247 A | 6/1985 | Lindenberger et al. | 179/111 |
| 4,533,795 A | 8/1985 | Baumhauer, Jr. et al. | 179/111 |
| 4,558,184 A | 12/1985 | Busch-Vishniac et al. | 179/111 |
| 4,710,744 A | 12/1987 | Wamstad | 338/4 |
| 4,740,410 A | 4/1988 | Muller et al. | 428/133 |
| 4,744,863 A | 5/1988 | Guckel et al. | 156/653 |
| 4,776,019 A | 10/1988 | Miyatake | 381/174 |

(Continued)

FOREIGN PATENT DOCUMENTS

| | | |
|---|---|---|
| EP | 0 788 157 A2 | 6/1997 |
| JP | 60-077434 A | 5/1985 |

(Continued)

OTHER PUBLICATIONS

*Microphone industry to expand MEMS-based offerings*, The Information Network, online <www.theinformationnet.com>, printed Feb. 1, 2005, Nov. 14, 2003, 2 pages.

(Continued)

*Primary Examiner* — Shaun Campbell
(74) *Attorney, Agent, or Firm* — Wolf, Greenfield & Sacks, P.C.

(57) ABSTRACT

A MEMS device has a substrate with a structure surface and an opposing exterior surface, microstructure formed on the structure surface of the substrate, and a cap coupled with the substrate to form a hermetically sealed interior chamber containing the microstructure. The substrate forms a trench extending from, and being open to, the opposing exterior surface to produce a sensor region and a second region. Specifically, the second region is radially outward of the sensor region. The MEMS device also has a spring integrally formed at least in part within the trench to mechanically connect the sensor region and the second region, and other structure integral with the substrate. The spring or the other structure at least in part hermetically seal the interior chamber.

20 Claims, 8 Drawing Sheets

(56) References Cited

U.S. PATENT DOCUMENTS

| | | | |
|---|---|---|---|
| 4,800,758 A | 1/1989 | Knecht et al. | 73/727 |
| 4,825,335 A | 4/1989 | Wilner | 361/283 |
| 4,853,669 A | 8/1989 | Guckel et al. | 338/4 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 4,996,082 A | 2/1991 | Guckel et al. | 427/99 |
| 5,067,007 A | 11/1991 | Kanji et al. | 357/74 |
| 5,090,254 A | 2/1992 | Guckel et al. | 73/862.59 |
| 5,105,258 A | 4/1992 | Silvis et al. | 257/748 |
| 5,113,466 A | 5/1992 | Acarlar et al. | 385/88 |
| 5,146,435 A | 9/1992 | Bernstein | 367/181 |
| 5,172,213 A | 12/1992 | Zimmerman | 257/796 |
| 5,178,015 A | 1/1993 | Loeppert et al. | 73/718 |
| 5,188,983 A | 2/1993 | Guckel et al. | 437/209 |
| 5,207,102 A | 5/1993 | Takahashi et al. | 73/727 |
| 5,241,133 A | 8/1993 | Mullen, III et al. | 174/52.4 |
| 5,273,939 A | 12/1993 | Becker et al. | 437/209 |
| 5,303,210 A | 4/1994 | Bernstein | 367/181 |
| 5,314,572 A | 5/1994 | Core et al. | 156/643 |
| 5,315,155 A | 5/1994 | O'Donnelly et al. | 257/711 |
| 5,317,107 A | 5/1994 | Osorio | 174/52.4 |
| 5,336,928 A | 8/1994 | Neugebauer et al. | 257/758 |
| 5,452,268 A | 9/1995 | Bernstein | 367/181 |
| 5,468,999 A | 11/1995 | Lin et al. | 257/784 |
| 5,490,220 A | 2/1996 | Loeppert | 381/168 |
| 5,515,732 A | 5/1996 | Willcox et al. | 73/724 |
| 5,593,926 A | 1/1997 | Fujihira | 437/209 |
| 5,596,222 A | 1/1997 | Bernstein | 257/620 |
| 5,608,265 A | 3/1997 | Kitano et al. | 257/738 |
| 5,629,566 A | 5/1997 | Doi et al. | 257/789 |
| 5,633,552 A | 5/1997 | Lee et al. | 310/311 |
| 5,658,710 A | 8/1997 | Neukermans | 430/320 |
| 5,684,324 A | 11/1997 | Bernstein | 257/415 |
| 5,692,060 A | 11/1997 | Wickstrom | 381/169 |
| 5,740,261 A | 4/1998 | Loeppert et al. | 381/168 |
| 5,828,127 A | 10/1998 | Yamagata et al. | 257/706 |
| 5,870,482 A | 2/1999 | Loeppert et al. | 381/174 |
| 5,901,046 A | 5/1999 | Ohta et al. | 361/760 |
| 5,923,995 A | 7/1999 | Kao et al. | 438/460 |
| 5,939,633 A | 8/1999 | Judy | 73/514.32 |
| 5,945,605 A | 8/1999 | Julian et al. | 73/727 |
| 5,956,292 A | 9/1999 | Bernstein | 367/140 |
| 5,960,093 A | 9/1999 | Miller | 381/324 |
| 5,994,161 A | 11/1999 | Bitko et al. | 438/53 |
| 6,084,292 A | 7/2000 | Shinohara | 257/676 |
| 6,128,961 A | 10/2000 | Haronian | 73/774 |
| 6,169,328 B1 | 1/2001 | Mitchell et al. | 257/778 |
| 6,243,474 B1 | 6/2001 | Tai et al. | 381/174 |
| 6,249,075 B1 | 6/2001 | Bishop et al. | 310/338 |
| 6,309,915 B1 | 10/2001 | Distefano | 438/127 |
| 6,329,706 B1 | 12/2001 | Nam | 257/666 |
| 6,384,472 B1 | 5/2002 | Huang | 257/680 |
| 6,384,473 B1 | 5/2002 | Peterson et al. | 257/680 |
| 6,401,545 B1 | 6/2002 | Monk et al. | 73/756 |
| 6,433,401 B1 | 8/2002 | Clark et al. | 257/524 |
| 6,505,511 B1 | 1/2003 | Geen et al. | 73/504.12 |
| 6,522,762 B1 | 2/2003 | Mullenborn et al. | 381/174 |
| 6,535,460 B2 | 3/2003 | Loeppert et al. | 367/181 |
| 6,548,895 B1 | 4/2003 | Benavides et al. | 257/712 |
| 6,552,469 B1 | 4/2003 | Pederson et al. | 310/309 |
| 6,617,683 B2 | 9/2003 | Lebonheur et al. | 257/707 |
| 6,667,189 B1 | 12/2003 | Wang et al. | 438/53 |
| 6,667,557 B2 | 12/2003 | Alcoe et al. | 257/777 |
| 6,677,176 B2 | 1/2004 | Wong et al. | 438/50 |
| 6,704,427 B2 | 3/2004 | Kearey | 381/355 |
| 6,711,317 B2 | 3/2004 | Jin et al. | |
| 6,732,588 B1 | 5/2004 | Mullenborn et al. | 73/715 |
| 6,741,709 B2 | 5/2004 | Kay et al. | 381/175 |
| 6,753,583 B2 | 6/2004 | Stoffel et al. | 257/416 |
| 6,768,196 B2 | 7/2004 | Harney et al. | 257/729 |
| 6,781,231 B2 | 8/2004 | Minervini | 257/704 |
| 6,812,620 B2 | 11/2004 | Scheeper et al. | 310/324 |
| 6,816,301 B1 | 11/2004 | Schiller | 359/290 |
| 6,821,819 B1 | 11/2004 | Benavides et al. | 438/122 |
| 6,829,131 B1 | 12/2004 | Loeb et al. | 361/234 |
| 6,847,090 B2 | 1/2005 | Loeppert | 257/418 |
| 6,857,312 B2 | 2/2005 | Choe et al. | 73/170.13 |
| 6,859,542 B2 | 2/2005 | Johannsen et al. | 381/174 |
| 6,914,992 B1 | 7/2005 | van Halteren et al. | 381/113 |
| 6,955,988 B2 | 10/2005 | Nevin et al. | 438/700 |
| 6,984,886 B2 | 1/2006 | Ahn et al. | 257/698 |
| 7,066,004 B1 | 6/2006 | Kohler | 73/1.38 |
| 7,166,911 B2 | 1/2007 | Karpman et al. | 257/711 |
| 7,268,463 B2 | 9/2007 | Li et al. | 310/209 |
| 7,551,048 B2 | 6/2009 | Iwata et al. | 335/78 |
| 7,839,052 B2 | 11/2010 | Wu et al. | 310/321 |
| 7,871,865 B2 | 1/2011 | Sengupta et al. | 438/126 |
| 8,103,027 B2 | 1/2012 | Zhang et al. | 381/175 |
| 8,217,474 B2 | 7/2012 | Lee et al. | |
| 8,344,487 B2 | 1/2013 | Zhang et al. | 257/669 |
| 8,698,292 B2 | 4/2014 | Najafi et al. | 257/678 |
| 8,906,730 B2 | 12/2014 | Graham et al. | 438/53 |
| 9,422,156 B2 | 8/2016 | Smeys | B81C 1/00238 |
| 2001/0055836 A1 | 12/2001 | Kunda | 438/108 |
| 2002/0102004 A1 | 8/2002 | Minervini | 381/175 |
| 2002/0125559 A1 | 9/2002 | Mclellan | 257/690 |
| 2003/0016839 A1 | 1/2003 | Loeppert et al. | 381/174 |
| 2003/0133588 A1 | 7/2003 | Pedersen | 381/423 |
| 2003/0189222 A1 | 10/2003 | Itou et al. | 257/200 |
| 2004/0041254 A1 | 3/2004 | Long et al. | 257/703 |
| 2004/0056337 A1 | 3/2004 | Hasebe et al. | 257/667 |
| 2004/0179705 A1 | 9/2004 | Wang et al. | 381/175 |
| 2004/0184632 A1 | 9/2004 | Minervini | 381/355 |
| 2004/0187633 A1 | 9/2004 | Kay et al. | 381/355 |
| 2004/0262781 A1 | 12/2004 | Germain et al. | 257/787 |
| 2005/0005421 A1 | 1/2005 | Wang et al. | 29/594 |
| 2005/0018864 A1 | 1/2005 | Minervini | 381/175 |
| 2005/0089188 A1 | 4/2005 | Feng | 381/396 |
| 2005/0093117 A1 | 5/2005 | Masuda et al. | 257/676 |
| 2005/0178208 A1 | 8/2005 | Benzel et al. | 73/715 |
| 2006/0246630 A1 | 11/2006 | Sunohara et al. | 438/125 |
| 2007/0040231 A1 | 2/2007 | Harney et al. | 257/415 |
| 2007/0042521 A1 | 2/2007 | Yama | 438/48 |
| 2011/0127623 A1 | 6/2011 | Fueldner et al. | 257/716 |
| 2011/0165717 A1* | 7/2011 | Lee | B81B 7/0061 438/50 |
| 2012/0049298 A1 | 3/2012 | Schlarmann et al. | 257/415 |
| 2012/0068278 A1 | 3/2012 | Knipe et al. | |
| 2012/0248552 A1* | 10/2012 | Benzel | G01P 15/123 257/415 |
| 2012/0264250 A1* | 10/2012 | Graham | B81B 3/0072 438/53 |
| 2014/0217521 A1 | 8/2014 | Johari-Galle et al. | 257/415 |
| 2014/0339656 A1* | 11/2014 | Schlarmann | G01L 9/0042 257/415 |
| 2014/0353772 A1* | 12/2014 | Stermer, Jr. | B81C 1/00325 257/415 |
| 2015/0197419 A1* | 7/2015 | Cheng | B81B 7/0006 257/418 |
| 2016/0090297 A1 | 3/2016 | Zhang et al. | |
| 2016/0229688 A1 | 8/2016 | Gu et al. | B81B 7/0048 |

FOREIGN PATENT DOCUMENTS

| | | |
|---|---|---|
| JP | 62-241335 A | 10/1987 |
| JP | 05-226501 A | 9/1993 |
| JP | 07-142518 A | 6/1995 |
| JP | 08-116007 A | 5/1996 |
| WO | WO 83/01362 | 4/1983 |
| WO | WO 91/05368 A | 4/1991 |
| WO | WO 01/20948 | 3/2001 |
| WO | WO 02/45463 | 6/2002 |
| WO | WO 2004/022477 | 3/2004 |
| WO | WO 2005/036698 | 4/2005 |
| WO | WO 2007/030345 A2 | 3/2007 |
| WO | WO 2012/037537 A2 | 3/2012 |
| WO | WO 2016/112463 A1 | 7/2016 ............ B81B 7/02 |

(56) References Cited

OTHER PUBLICATIONS

*Phone-Or/Technology*, online <file://C:\Documents%20and%20Settings\bmansfield\Local%20Settings\Temporary%20Internet%20Files\OLKE\Phone-Or%20% . . . >, printed Feb. 1, 2005, 2 pages.
*Liquid Crystal Polymer (LCP) Air Cavity Packages*, Quantum Leap Packaging, Inc., Brochure, 2004, 2 pages.
Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.
Bernstein, *MEMS Air Acoustics Research the Charles Stark Draper Laboratory*, PowerPoint Presentation, Aug. 1999, 8 pages.
Bernstein et al., *High Sensitivity MEMS Ultrasound Arrays by Lateral Ferroelectric Polarization*, Solid-State Sensor and Actuator Workshop, Jun. 4-8, 2000, 4 pages.
Blackwell, *The Electronic Packaging Handbook*, CRC Press LLC, pp. 2-3, 7-1, 7-12, A-9, and A-11, 2000.
Brown, William D. (Ed.), *Advanced Electronic Packaging with Emphasis on Multichip Modules*, Institute of Electrical and Electronics Engineers, Inc., pp. 4-8, 568, 1999.
Chen et al., *Single-Chip Condenser Miniature Microphone with a High Sensitive Circular Corrugated Diaphragm*, IEEE, 2002, 4 pages.
Cunningham et al., *Wide bandwidth silicon nitride membrane microphones*, SPIE vol. 3223, Sep. 1997, 9 pages.
Department of Defense, *Test Method Standard Microcircuits*, FSC 5962, completed 1997.
Fan et al., *Development of Artificial Lateral-Line Flow Sensors*, Solid-State Sensor, Actuator and Microsystems Workshop, Jun. 2-6, 2002, 4 pages.
Fuldner et al., *Silicon Microphones with Low Stress Membranes*, The 11th International Conference on Solid-State Sensors and Actuators, Jun. 10-14, 2001, 4 pages.
Gale et al., *MEMS Packaging*, University of Utah, Microsystems Principles, PowerPoint Presentation, Oct. 11, 2001, 8 pages.
Hall et al., *Self-Calibrating Micromachined Microphones with Integrated Optical Displacement Detection*, The 11th International Conference on Solid State Sensors and Actuators, Jun. 10-14, 2001, 4 pages.
Harper (Editor-in-Chief), *Electronic Packaging and Interconnection Handbook*, Third Edition, McGraw-Hill, Chapter 7, Section 7.2.3.1, 2000, 7 pages.
Heuberger, *Mikromechanik*, Springer Verlang A.G., pp. 470-476, 1989 (With translation).
Hsieh et al., *A Micromachined Thin-film Teflon Electret Microphone*, Department of Electrical Engineering California Institute of Technology, 1997, 4 pages.
Kabir et al., *High Sensitivity Acoustic Transducers with Thin P+ Membranes and Gold Back-Plate*, Sensors and Actuators, vol. 78, Issue 2-3, Dec. 17, 1999, 17 pages.
Ko et al., *Piezoelectric Membrane Acoustic Devices*, IEEE, 2002, 4 pages.
Kopola et al., *MEMS Sensor Packaging Using LTCC Substrate Technology*, VTT Electronics, Proceedings of SPIE vol. 4592, 2001, pp. 148-158.
Ma et al., *Design and Fabrication of an Integrated Programmable Floating-Gate Microphone*, IEEE, 2002, 4 pages.
Mason, Jack, *Companies Compete to Be Heard on the Increasingly Noisy MEMS Phone Market*, Small Times: News about MEMS, Nanotechnology and Microsystems, Jul. 18, 2003, 4 pages.
Maxim Integrated Products, *Electret Condenser Microphone Cartridge Preamplifier*, Maxim Integrated Products, Jul. 2002, 9 pages.

Neumann, Jr. et al., *A Fully-Integrated CMOS-MEMS Audio Microphone*, The 12th International Conference on Solid State Sensors, Actuators and Microsystems Jun. 8-12, 2003, 4 pages.
Ono et al., *Design and Experiments of Bio-mimicry Sound Source Localization Sensor with Gimbal-Supported Circular Diaphragm*, The 12th International Conference on Solid State Sensors, Actuators and Microsystems, Jun. 8-12, 2003, 4 pages.
Pecht, Michael (Ed.), *Handbook of Electronic Package Design*, Marcel Dekker, Inc. pp. 173, 179, 196, 210, 736, 744, 821 and 832, 1991.
Pedersen et al., *A Polymer Condenser Microphone on Silicon with On-Chip CMOS Amplifier*, Solid State Sensors and Actuators, 1997, 3 pages.
Prismark Partners, "The Prismark Wireless Technology Report—Mar. 2005", *Prismark Partners LLC*; www.prismark.com, pp. 1-44.
Schafer et al., *Micromachined Condenser Microphone for Hearing Aid Use*, Solid-State Sensor and Actuator Workshop, Jun. 8-11, 1998, 4 pages.
Sheplak et al., *A Wafer-Bonded, Silicon-Nitride Membrane Microphone with Dielectrically-Isolated, Single-Crystal Silicon Piezoresistors*, Solid-State Sensor and Actuator Workshop, Jun. 8-11, 1998, 4 pages.
Stahl, et al., *Thin Film Encapsulation of Acceleration Sensors Using Polysilicon Sacrificial Layer, Transducers '03, The 12th International Conference on Solid State Sensors, Actuators and Microsystems*, Jun. 8-12, 2003, 4 pages.
Tummala, Rao R. et al. (Eds.), *Microelectronics Packaging Handbook, Semiconductor Packaging Part II*, Second Edition, Chapman & Hall, pp. 11-12, 1997.
Weigold et al., *A MEMS Condenser Microphone for Consumer Applications*, Analog Devices, Inc. and Pixtronix, Inc., Jan. 2006, 4 pages.
Yovcheva et al., *Investigation on Surface Potential Decay in PP Corona Electrets*, BPU-5: Fifth General Conference of the Balkan Physical Union, Aug. 25-29, 2003, 4 pages.
Zou et al., *A Novel Integrated Silicon Capacitive Microphone—Floating Electrode "Electret" Microphone (FEEM)*, Journal of Microelectromechanical Systems, vol. 7, No. 2, Jun. 1998, 11 pages.
Judy, "*Microelectromechanical systems (MEMS): fabrication, design and applications*", Electrical Engineering Department, Institute of Physics Publishing, Smart Materials and Structures, vol. 10, pp. 1115-1134 Nov. 26, 2001.
Tilmans et al., "*The indent reflow sealing (IRS) technique—a method for the fabrication of sealed cavities for MEMS devices*", IEEE, Journal of Microelectro-mechanical Systems, vol. 9, Issue 2, pp. 206-217, Jul. 2000 (Abstract only—3 pages).
Rugg et al., *Thermal Package Enhancement Improves Hard Disk Drive Data Transfer Performance*. Pan Pacific Microelectronics Symposium. Proceedings of the Technical Program, Island of Maui, Hawaii, Feb. 5-7, 2002, pp. 451-456.
Final Office Action, U.S. Appl. No. 13/757,217, 10 pages, dated Feb. 27, 2015.
Non Final Office Action, U.S. Appl. No. 13/757,217, 20 pages, dated Jul. 2, 2014 [2550/E20].
Response to Office Action of Jul. 2, 2014—U.S. Appl. No. 13/757,217, filed Dec. 20, 2014, 29 pages.
Request for Continued Examination (RCE)—U.S. Appl. No. 13/757,217, filed Aug. 27, 2015, 13 pages.
Response to Notice of Non-Compliant Amendment of Mar. 11, 2016—U.S. Appl. No. 13/757,217, filed Jun. 17, 2016, 8 pages.
Office Action—U.S. Appl. No. 13/757,217, dated Jun. 27, 2016, 30 pages.

* cited by examiner

MECHANICALLY ISOLATED MEMS DEVICE

FIELD OF THE INVENTION

The invention generally relates to MEMS device and, more particularly, the invention relates to mitigating stress in MEMS devices.

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The associated electronics, substrate, and movable structure typically are formed on one or more dies (referred to herein simply as a "die") that are secured within a package. For example, the package, which typically encapsulates such a die, may be produced from ceramic or plastic. The package includes interconnects that permit the electronics to transmit the movement data to the external devices. To secure the die to the package interior, the bottom surface of the die commonly is bonded (e.g., with an adhesive or solder) to an internal surface (e.g., a die attach pad) of the package. Other package designs simply cap the MEMS die to provide a so-called "chip-level" package, which can be directly coupled with a printed circuit board.

Problems can arise, however, when the temperatures of the two surfaces change. For example, the temperature of a chip-level package substrate and that of an underlying printed circuit board can change. When both have different coefficients of thermal expansion ("CTE"), the board can apply a mechanical stress to the substrate of the die. The same stress can arise when the aggregate CTE of the package and printed circuit board differ. This stress undesirably can bend, torque or flex the die substrate to an unknown curvature. Substrate bending or flexing consequently can affect movement of the die structures and the functioning of the electronics, thus causing the output data representing the property being measured (e.g., acceleration) to be erroneous.

In a similar manner, mechanically induced linear or torsional stress applied to the circuit board also can be translated to the die, thus causing the same undesirable effects.

SUMMARY OF VARIOUS EMBODIMENTS

In accordance with one embodiment of the invention, a MEMS device has a substrate with a structure surface and an opposing exterior surface, microstructure formed integrally with the structure surface of the substrate, and a cap coupled with the substrate to form a hermetically sealed interior chamber containing the microstructure. The substrate forms a trench extending from, and being open to, the opposing exterior surface to produce a sensor region and a second region. Specifically, the second region is radially outward of the sensor region. The MEMS device also has a spring integrally formed at least in part within the trench to mechanically connect the sensor region and the second region, and other structure integral with the substrate. The spring or the other structure at least in part hermetically seal the interior chamber.

Among other shapes, the spring may form a serpentine shape. The other structure may include any of a number of different elements. When acting to at least in part seal the chamber, however, the other structure may include a connection structure that connects the sensor region and the second region, and be integral with the substrate. In that case, the other structure may include an insulator layer (e.g., an oxide) that forms at least a part of the structure surface of the substrate. When not acting as a seal, however, the other structure may include any of a number of different elements, such as circuit traces, a pad, fill, or additional microstructure.

The sensor region preferably extends from the structure surface of the substrate to the opposing exterior surface of the substrate. In a similar manner, the second region also may extend from the structure surface of the substrate to the opposing exterior surface of the substrate. To further mitigate stress from a package, the sensor region at the opposing exterior surface may be recessed relative to the second region at the opposing exterior surface.

The cap preferably couples with the second region of the substrate. Moreover, the microstructure may include any of a variety of different types of structures, such as inertial sensor microstructure or pressure sensor microstructure.

In accordance with another embodiment of the invention, a MEMS device has a substrate with a structure surface and an opposing exterior surface, microstructure formed on the structure surface of the substrate, and a cap coupled with the substrate to form a hermetically sealed interior chamber containing the microstructure. The substrate forms a trench extending from and open to the opposing exterior surface to form a sensor region and a second region. Specifically, the second region is radially outward of the sensor region. The MEMS device also has a connection structure that connects the sensor region and the second region. The connection structure is integral with the substrate and at least in part hermetically seals the interior chamber.

In accordance with other embodiments of the invention, a method of producing a MEMS device provides a MEMS die having a substrate with a structure surface and an opposing exterior surface, microstructure formed on the structure surface of the substrate, other structure integral with the substrate, and a cap coupled with the substrate to form a hermetically sealed interior chamber containing the microstructure. The method then forms a trench extending from and open to the opposing exterior surface to form a sensor region and a second region. As with other embodiments, the second region is radially outward of the sensor region. The method also forms a spring between the sensor region and the second region. The spring or the other structure at least in part hermetically seals the interior chamber.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a wafer-level packaged MEMS die is configured to mitigate stress while maintaining hermeticity. To that end, the die has a trench and connective structure that together mitigate stress and hermetically seal the sensitive internal microstructure. Details of illustrative embodiments are discussed below.

Figure 1:
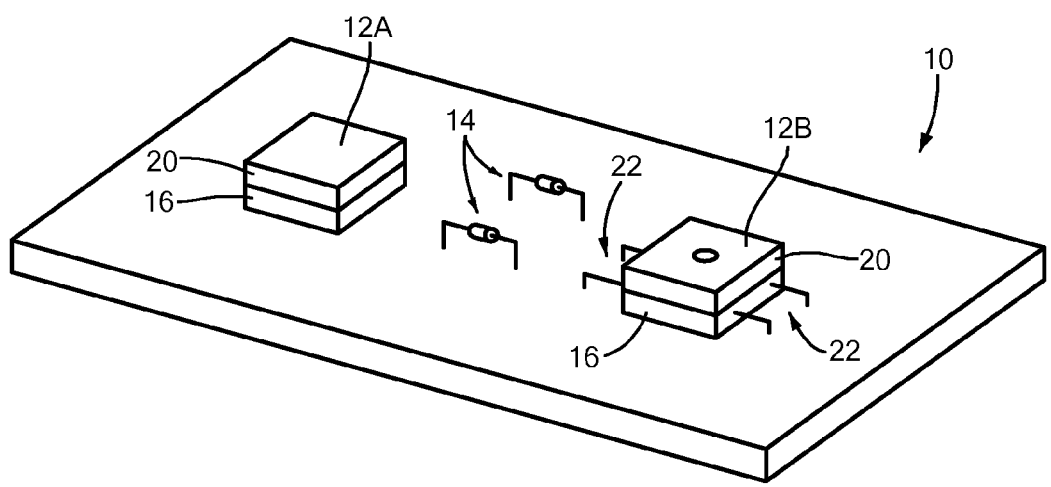
FIG. 1 schematically shows a higher-level system that may incorporate a capped MEMS die configured in accordance with illustrative embodiments of the invention.

FIG. 1 schematically shows a printed circuit board 10 having capped MEMS dies and configured in accordance with illustrative embodiments of the invention. This printed circuit board 10 may be part of a larger system, such as an automobile airbag system, a transducer system, a guidance system, a computer system, or other application. To those ends, the printed circuit board 10 supports and connects a plurality of different circuit components identified in the drawing by reference numbers 12A, 12B, and 14 (discussed below) in the prescribed manner. FIG. 1 shows only a few exemplary components 12A, 12B, and 14 for simplicity.

The components 12A, 12B, and 14 shown include a hermetically sealed capped MEMS die 12A (capped MEMS dies 12A also generally are referred to as a "capped MEMS microchips" or "capped devices") surface mounted to the printed circuit board 10, an unsealed capped MEMS die 12B, and other active or passive circuit components 14. Among other things, the capped MEMS dies 12A and 12B have a sensor (i.e., MEMS microstructure 18) integrally formed with the substrate, and may include circuitry. In illustrative embodiments, an integral structure 18 is formed using conventional micromachining processes, which use additive and/or subtractive processes to form a generally monolithic die/substrate. This is in contrast to a bonded component (e.g., a cap bonded to a die), which is not integral to the die to which it is attached.

Among other things, the sealed capped MEMS die 12A may be an inertial sensor, such as a MEMS accelerometer or MEMS gyroscope, a MEMS optical switch, or a MEMS electrostatic switch. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

The unsealed capped MEMS die 12B may include functionality that requires access to the ambient environment, but some protection. For example, the unsealed capped MEMS die 12B may include a microphone or pressure sensor. One or both of the capped MEMS dies 12A and 12B may include circuitry, such as that included in IMEMS devices distributed by Analog Devices, Inc.

Both dies 12A and 12B thus have a device die 16 (also referred to as a "substrate 16") with structure 18 and/or circuitry 18 (both shown schematically in the figures and, for simplicity, identified by the same reference number 18), and a cap 20 protecting the structure 18 and/or circuitry 18. The sealed capped MEMS die 12A shown is surface mounted to the printed circuit board 10, while the unsealed capped MEMS die 12B has pins 22 to electrically connect to the printed circuit board 10. Either type of electrical interconnect method should suffice for various embodiments.

Figure 2:
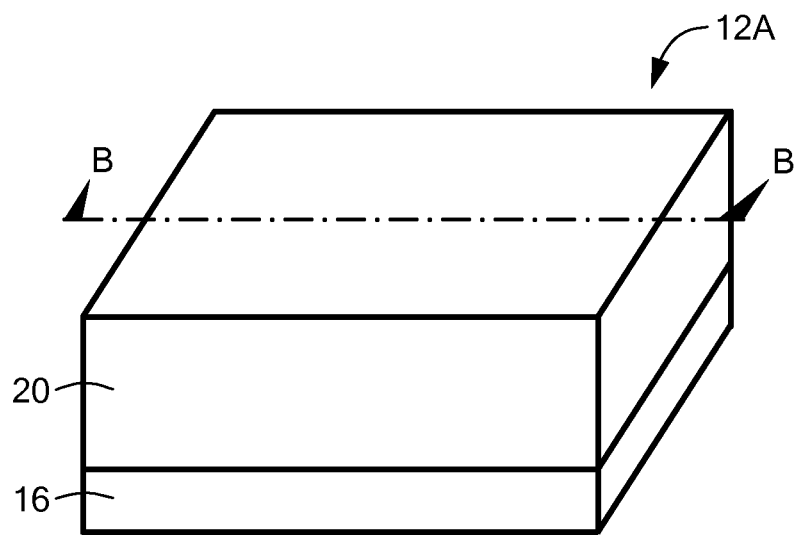
FIG. 2 schematically shows a perspective view of a capped MEMS device that may be configured in accordance with various embodiments of the invention.
Figure 3:
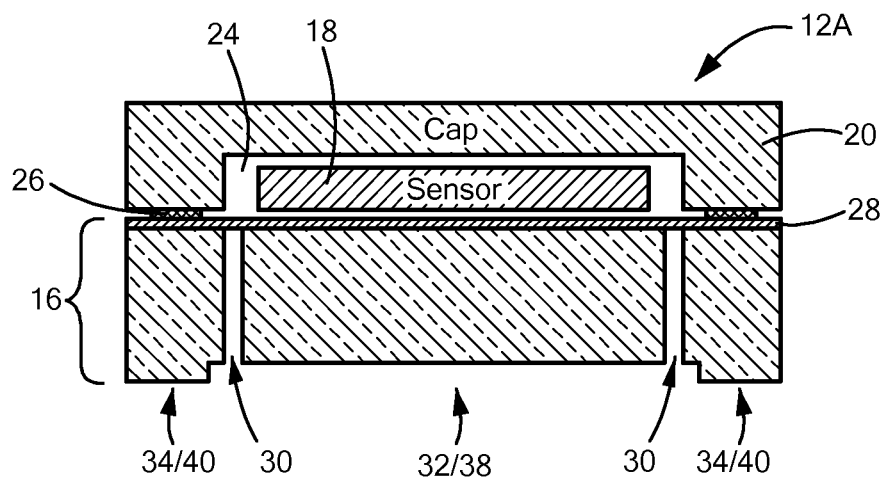
FIG. 3 schematically shows a cross-sectional view of the capped MEMS device of FIG. 2 configured in accordance with a first embodiment of the invention.

FIG. 2 schematically shows a perspective view of the capped MEMS die 12A of FIG. 1 configured in accordance with illustrative embodiments of the invention. FIG. 3 schematically shows a cross-sectional view of the capped MEMS die 12A of FIG. 2 across line B-B. As discussed in greater detail below, the capped MEMS die 12A has the prior noted die 16 containing functional element(s) (e.g., microstructure 18 and/or integrated circuitry 18 shown in FIG. 3), and the above noted cap 20 that together form a hermetically sealed interior chamber 24 for protecting the functional element(s) on the die 16. Rather than being integral with the die 16, the cap 20 preferably is bonded to the die 16 using conventional bonding processes and conventional bonding materials 26 (e.g., aluminum or aluminum germanium). A plurality of external contacts (not shown) provides electrical contact to the functional element(s) and other components.

As noted above, the functional element(s) on the die 16 may include microstructure 18 with or without circuitry 18. As noted above, FIG. 3 schematically shows a block within the interior chamber 24 that schematically represents either or both microstructure 18, circuitry 18, or both. In one example, the die 16 may have movable mass microstructure(s) 18 (not shown in detail) suspended above the top facing surface of the die 16, and interdigitated fingers (not shown) for detecting movement. Other embodiments may implement the microstructure and/or circuitry in other manners, such as using bulk acoustic wave techniques. Accordingly, discussion of specific MEMS devices or structures are not intended to limit various embodiments of the invention.

As discussed below, the substrate in the embodiment shown in FIG. 3 has a layer of insulator material ("insulator layer 28") to which at least some of the cap 20 is attached. Among other things, the insulator layer 28 may include a silicon oxide. It should be noted, however, that the insulation layer 28 may be formed from other material configurations. For example, the insulation layer 28 may be formed from a stack of materials used in semiconductor processing. As such, it may be considered more generally to be a "connecting layer 28." For example, the connecting layer 28 may be formed from a stack of alternating insulator/dielectric and semiconductor/conductor. As a further example, the connecting layer 28 may be formed from alternating layers of insulator and polysilicon, or alternating layers of insulator and metal. The term "insulating layer 28" thus is but one embodiment.

In addition, the die 16 also has a plurality of isolation trenches 30 that cooperate to mechanically at least in-part isolate the sensitive microstructure 18. Specifically, the trench(es) 30 may be considered to effectively form a radially interior region containing the sensor ("sensor region 32") and a radially exterior second region ("second region 34") for both 1) securing the cap 20 to the die 16, and 2) mounting the die 16 to the printed circuit board 10. In accordance with illustrative embodiments of the invention, at least one of the trench(es) 30 extend all the way to the bottom of the die 16. In other words, such trench(es) 30 are open to the bottom surface 36 of the die 16. The bottom surface 36 is the surface of the die 16 that is opposite to the surface having the microstructure 18, cap 20, etc.

Alternative embodiments may form the sensor region 32 and second region 34 in an opposite manner. For example, such embodiments may form the sensor region 32 radially outwardly of the second region 34.

As part of the die 16, the insulator layer 28 forms a thin membrane that effectively seals the hermetic chamber 24 from the openings of the trench(es) 30. This thin membrane also mechanically connects the sensor region 32 and the second region 34 of the die 16 and, as discussed below with regard to FIG. 6, can act as an etch stop when forming the trench(es) 30.

FIG. 3 also shows an additional but optional feature that further mitigates stress transmission from the printed circuit board 10 to the die 16. Specifically, the bottom surface 36 of the die 16 is considered to have to regions: a bottom surface of the sensor region 32 ("sensor region bottom surface 38") and a bottom surface of the second region 34 ("second region bottom surface 40"). In this embodiment, however, the sensor region bottom surface 38 is not co-planar with the second region bottom surface 40. Instead, the sensor region bottom surface 38 is slightly recessed relative to the second region bottom surface 40. Because it is recessed in this manner, the sensor region 32 should have no contact with the printed circuit board 10 to which it is mounted. Instead, in illustrative embodiments, only the second region 34 is in direct physical contact with the printed circuit board 10. Of course, some embodiments may omit this optional recessed region, permitting the sensor region 32 to contact the printed circuit board 10.

It should be noted that discussion of a printed circuit board 10 is but one of a number of different potential implementations. For example, some embodiments may secure the capped MEMS die 12A within a package, such as a ceramic cavity package commonly used to package MEMS devices. Accordingly, discussion of the printed circuit board 10 is not intended to limit various embodiments.

Figure 4A:
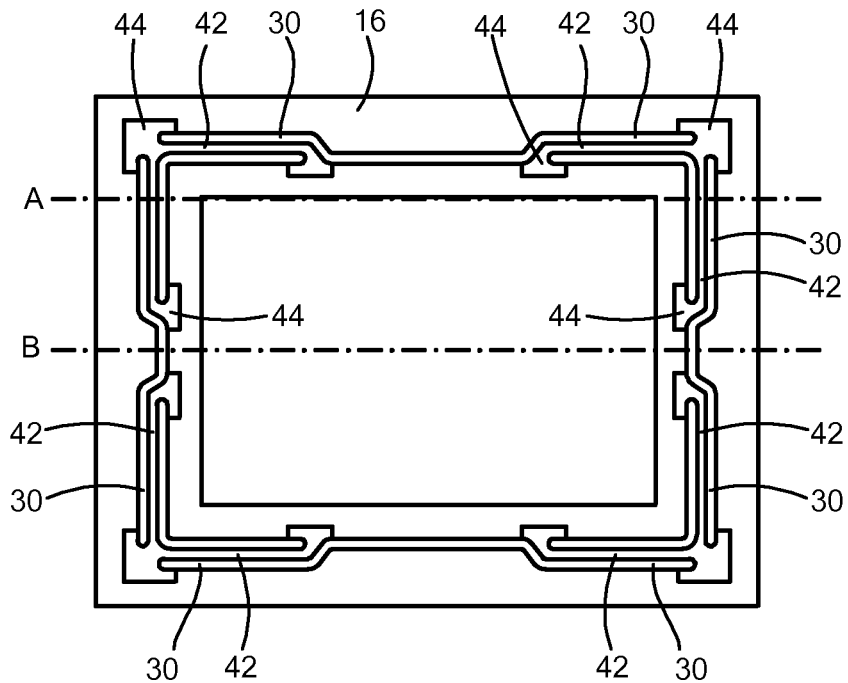
FIGS. 4A-4C schematically show additional details of the capped MEMS device of FIG. 3.
Figure 4B:
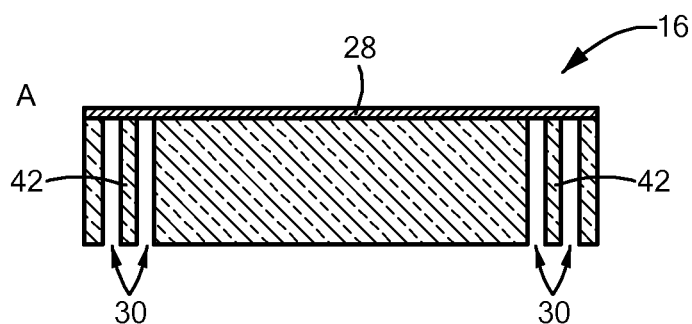
Figure 4C:
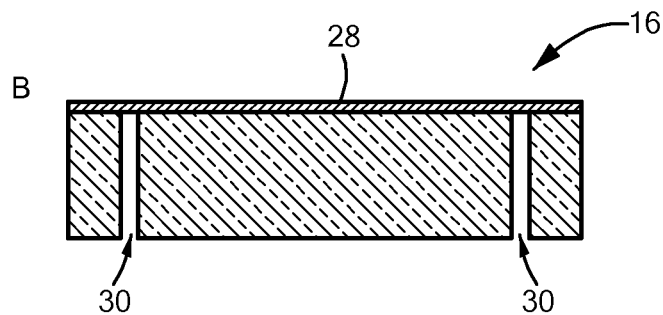

The capped MEMS die 12A also has a plurality of other structure not explicitly shown in FIG. 3. For example, the die 16 also preferably has one or more springs 42 integrally formed with the substrate and positioned within the trench(es) 30, circuit traces, vias, bond pads, other microstructure, etc. FIGS. 4A and 4B show the spring(s) 42 with a more detailed view of the substrate of one embodiment of the capped MEMS die 12A of FIGS. 2 and 3. FIG. 4B shows a cross-sectional view of the substrate across line a-a of FIG. 4A, while FIG. 4C shows the cross-sectional view of the substrate across line b-b of FIG. 4A. To show this detail, these views do not show the components in the interior chamber 24 (e.g., the microstructure 18, circuitry 18, traces, passivation layers, etc.) or the cap 20.

FIG. 4C shows a region of the die 16 that has no spring 42. Instead, that region just has a single trench 30 separating the two regions 32 and 34 of the die 16. FIGS. 4A and 4B show the springs 42 of this embodiment as integral members formed by the die 16 between at least two trenches 30. The spring 42 thus may be considered to be formed within a single trench 30, or form the boundary between two trenches 30. The trenches 30 of this embodiment are generally parallel in certain locations, but may diverge in other locations. Among other functions, the spring 42 also connects the sensor region 32 with the second region 34, and mitigates the impact of relative movement between the two sensor regions 32 and 34.

To those ends, this embodiment may be considered to have four springs 42 extending to each corner of the die 16. Each spring 42 extends between anchor structures or other stationary regions integrated into the die 16. For example, the top right spring 42 of FIG. 4A extends from an anchor 44 (or simply the die 16 itself) in a generally horizontal manner toward the right edge to an intermediate anchor 44 at the top right corner of the die 16. The spring 42 continues downwardly to a second anchor 44 almost midway down the top face of the die 16. This single spring 42 thus may be considered to have two sub-springs, or be two separate springs 42. Indeed, discussion of specific spring configurations are simply illustrative of one of a variety of different spring configurations those skilled in the art may implement.

In this embodiment of FIGS. 3, 4A, 4B, and 4C, the spring 42 does not materially serve the role of hermetically sealing the interior chamber 24. Instead, the (integral) insulator layer 28 acts as the other structure that provides the hermetic sealing functionality. Of course, some embodiments may have other structure that does not perform this role.

Figure 5A:
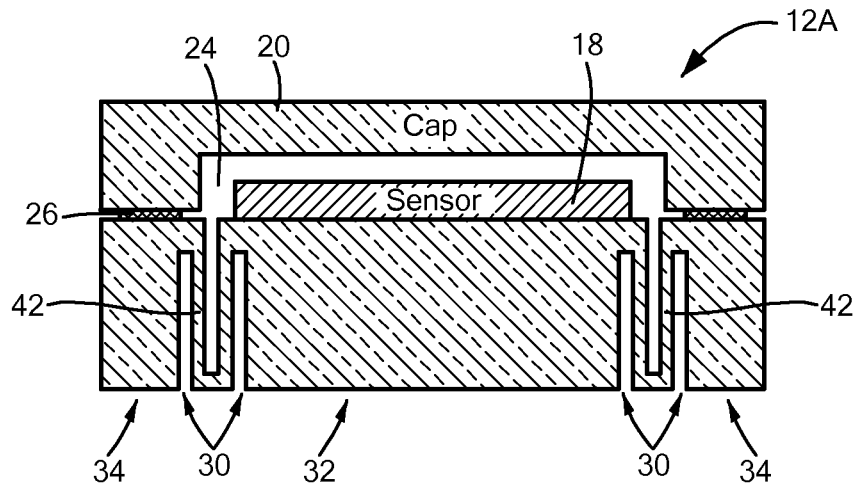
FIG. 5A schematically shows a cross-sectional view of the capped MEMS device of FIG. 2 configured in accordance with a second embodiment of the invention.
Figure 5B:
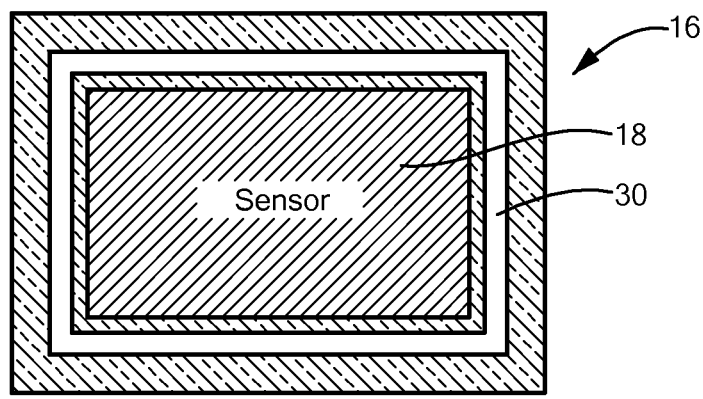
FIGS. 5B and 5C schematically show additional details of the capped MEMS device of FIG. 5A.
Figure 5C:
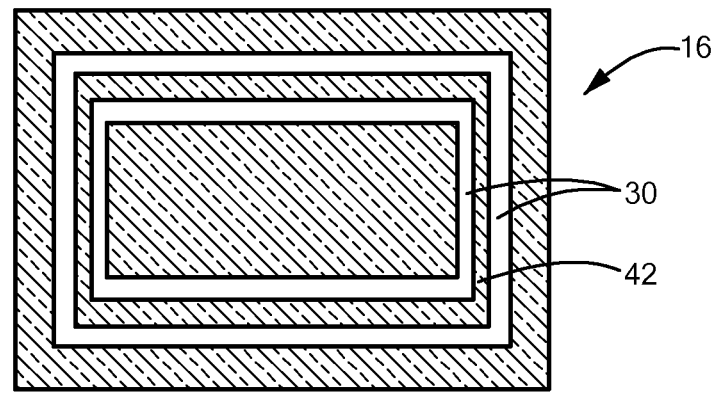

FIGS. 5A-5C, however, show another embodiment of the invention in which the integral spring 42 itself at least in part seals the interior chamber 24 (i.e., along with the die 16 and the cap 20). FIG. 5A thus schematically shows a cross-sectional view of the die 16 of FIG. 2 across line B-B configured in accordance with this embodiment. In a manner similar to the embodiments of FIGS. 3, 4A, 4B, and 4C, this embodiment also has one or more trenches 30 exposed to the bottom surface 36 of the die 16. Unlike that embodiment, however, this embodiment does not have an insulator layer that at least forms part of the hermetic seal of the interior chamber 24—such a structure is unnecessary. Instead, the spring 42 of this embodiment performs the requisite sealing function. In other words, the spring 42 serves the role of a (thin) membrane that, along with the die 16 and cap 20, serves at least as part of the hermetic seal of the interior chamber 24. This is in contrast to the insulator layer 28 of the embodiment of FIG. 3, in which the insulator layer 28 performs the hermetic sealing function. It should be noted that in this embodiment, the capped MEMS die 12A indeed has other structure integral with the substrate/die 16, but some of that other structure does not contribute to hermeticity of the interior chamber 24. For example, such other structure may include wirings/runners that connect circuitry to the die 12A.

The spring 42 of this embodiment may take on any of a number of forms, such as a serpentine form commonly used with MEMS devices. Corrugated, straight, or other spring configurations also may be used. To show more detail of the substrate/die 16, FIG. 5B schematically shows a top view of the die 16 without the bonded cap 20, while FIG. 5C schematically shows a bottom view of the die 16. The top view shows a top-facing trench 30 completely circumscribing the sensor with the bottom of the spring 42 (not shown in this view) maintaining the connection between the sensor and second regions 32 and 34. The bottom view shows two trenches 30 open to the bottom side 36 of the die 16.

This embodiment of the capped MEMS die 12A may form the bottom of the sensor region 32 to be substantially coplanar with the bottom of the spring 42 and/or the second region bottom surface 40. Other embodiments, however, may form the sensor region 32 to be recessed from the second region 34 in a manner similar to that of the embodiment of FIG. 3. Similar embodiments also may recess the spring 42 in a similar manner.

Figure 6:
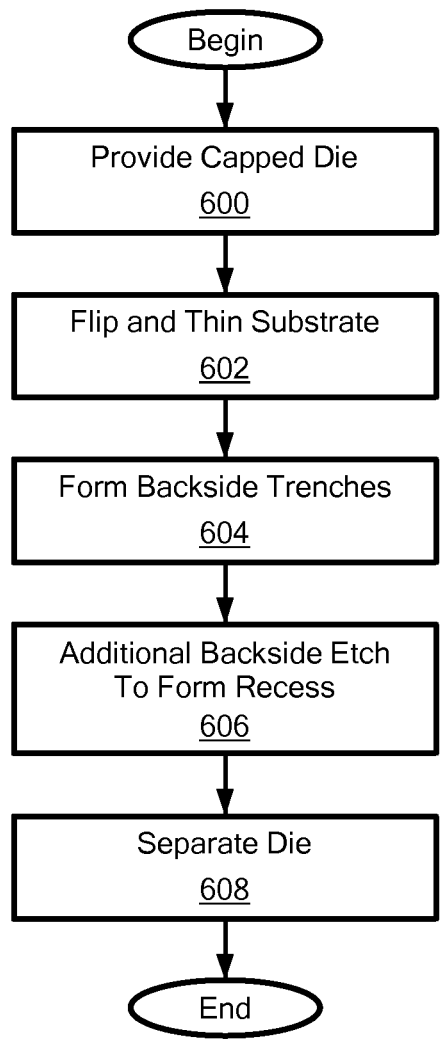
FIG. 6 shows a process of forming the capped MEMS device of FIG. 3 in accordance with illustrative embodiments of the invention.

FIG. 6 shows a process of forming the capped MEMS die 12A in accordance with illustrative embodiments of the invention. FIGS. 7A-7F schematically show the capped MEMS die 12A at various steps of the process of FIG. 6. It should be noted that this process is substantially simplified from a longer process that normally would be used to form the capped MEMS die 12A. Accordingly, the process of forming the capped MEMS die 12A may have many other steps, such as testing steps, other etching steps, or additional passivation steps, which those skilled in the art likely would use. In addition, some of the steps may be performed in a different order than that shown, or at the same time. Those skilled in the art therefore can modify the process as appropriate.

Moreover, as noted above and below, many of the discussed materials and structures are examples of a wide variety of different materials and structures that may be used. Those skilled in the art can select the appropriate materials and structures depending upon the application and other constraints. Accordingly, discussion of specific materials and some structures is not intended to limit all embodiments.

The process of FIG. 6 preferably uses bulk micromachining techniques, which form a plurality of capped MEMS dice on the same wafer/base at the same time. Although much less efficient, those skilled in the art can apply these principles to a process that forms only one capped MEMS device 12A.

Figure 7A:
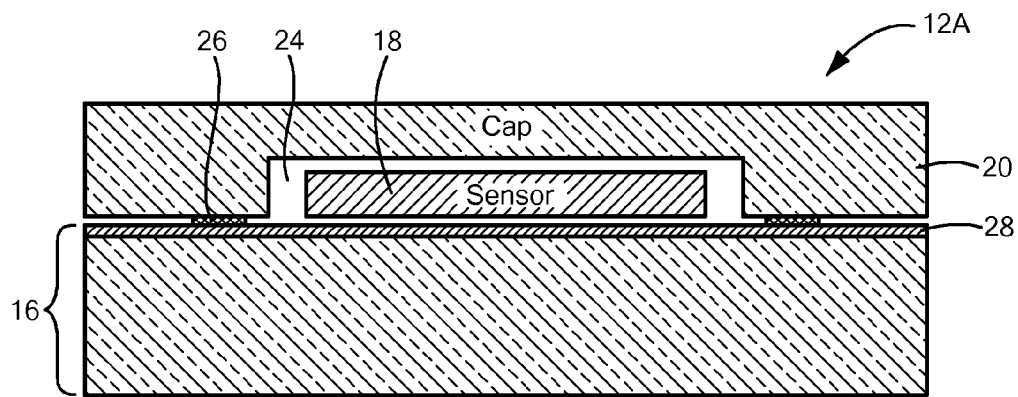
FIGS. 7A-7F schematically show the capped mems device of FIG. 3 at various steps of the process of FIG. 6.

The process of FIG. 6 begins at step 600, which provides a capped MEMS die 12A, such as that shown in FIG. 7A. As a bulk process, this preferably involves providing a wafer having a two dimensional array of capped MEMS dice 12A as shown in FIG. 7A. For simplicity, however, the remainder of this process (other than the last step) is discussed in terms of a single capped MEMS die 12A.

This capped MEMS die 12A of FIG. 7A has substantially most or all of the necessary components to function, such as the microstructure 18, circuitry 18, cap 20, hermetic interior chamber 24, traces, pads, etc. Unlike that of FIGS. 3 and 5A, however, the die 16 in this form does not include the stress mitigation features discussed above (e.g., trenches 30 and a membrane forming and connecting the die regions). As such, this capped MEMS die 12A likely would be more susceptible to stress.

After providing the capped MEMS die 12A, the process next turns over the die 16 (i.e., 180 degrees) and thins the die 16 (step 602). Among other ways, the process may use conventional backgrinding and/or etching processes to reduce the thickness of the die 16 a desired amount.

Figure 7B:
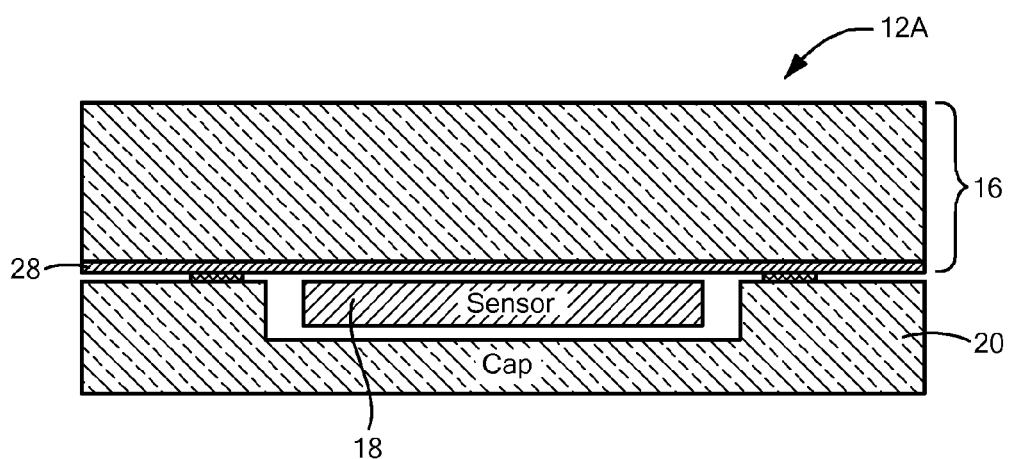
Figure 7C:
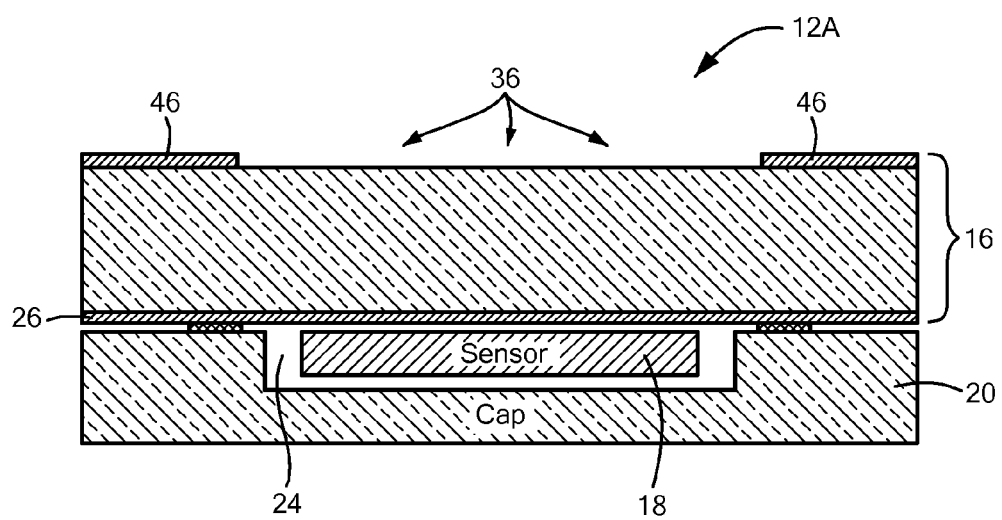

Next, the process continues to step 604 by forming the trenches 30 (i.e., backside trenches). To that end, this step first may deposit a bottom oxide layer 46 on the bottom side of the die 16, which, from the perspective of FIG. 7B, is facing upwardly. Then this step applies a hard mask etch (e.g., by using a plasma enhanced chemical vapor deposition) to expose at least the sensor region 32, as shown in FIG. 7C. Now that the appropriate region of the die bottom surface 36 is exposed, step 604 deposits a photoresist on the die bottom surface 36 and, using photolithography techniques, forms a photoresist mask 48 on the bottom surface 36.

Figure 7D:
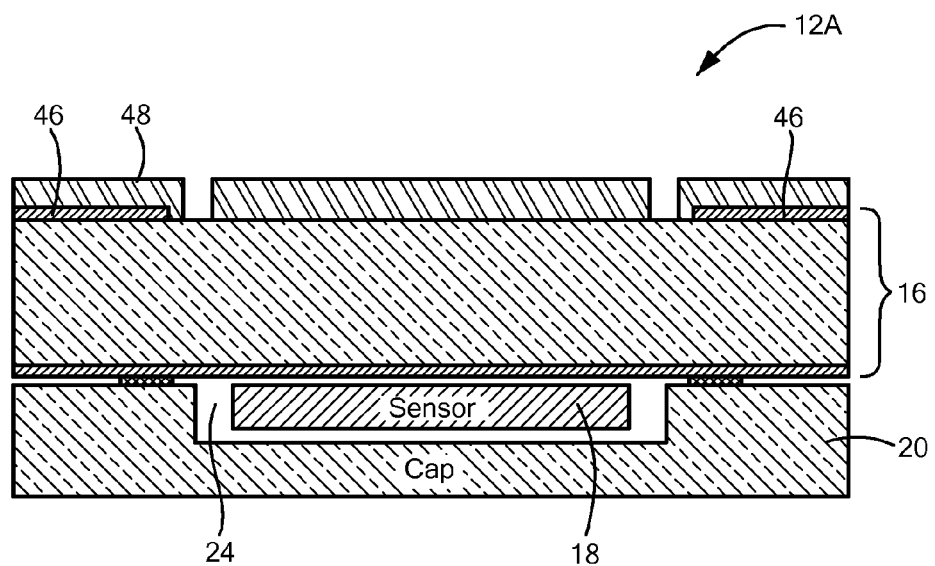
Figure 7E:
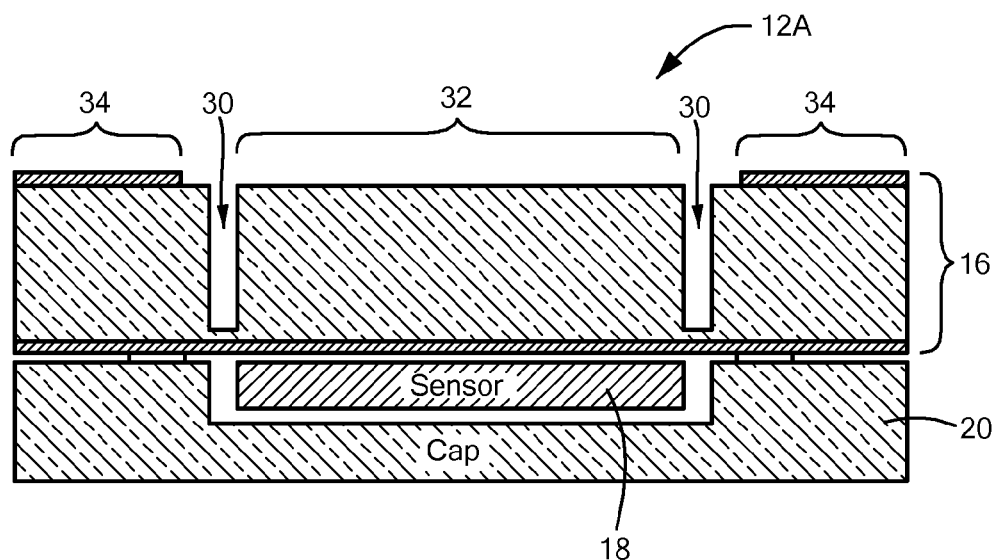

FIG. 7D schematically shows a cross-sectional view of the photoresist mask 48 at this stage of the process. As shown, the mask has openings for channeling etching fluid, such as hydrofluoric acid, onto the appropriate region of the backside of the die 16. This step then directs the etching fluid through the mask and, consequently through a significant portion of the die 16. The insulator layer 28 on the top surface of the die 16 (facing downwardly in FIG. 7D) acts as the etch stop for this part of the process. FIG. 7E schematically shows a cross-sectional view of the capped MEMS die 12A at this stage of the process, thus completing step 604.

Figure 7F:
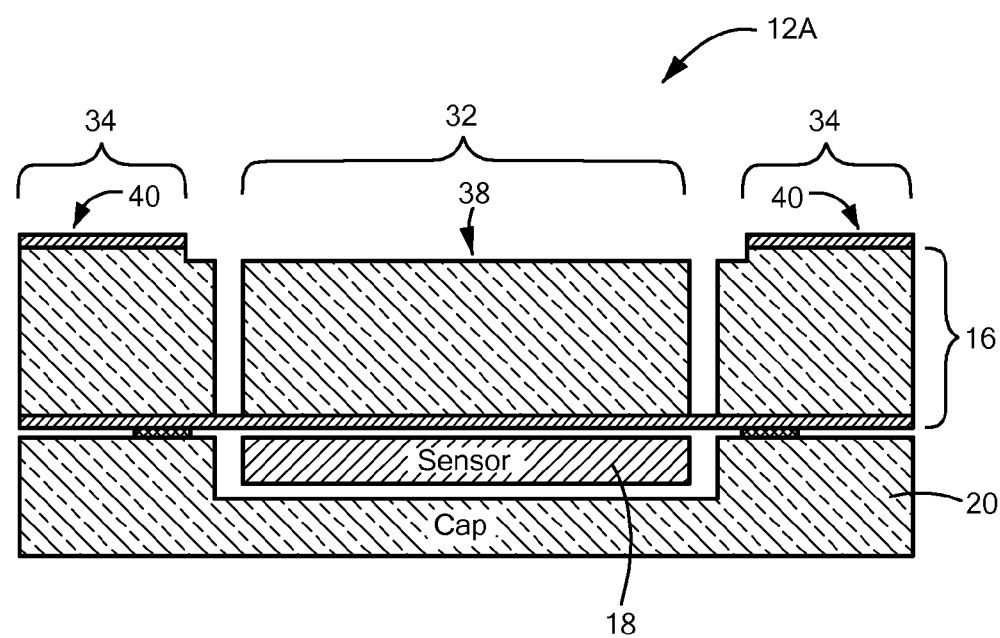

After forming the trenches 30, step 606 applies an additional etch to the backside of the die 16 to form the recessed sensor region 32. FIG. 7F schematically shows the capped MEMS die 12A at this stage of the process. In some embodiments, there is no need to remove the remaining bottom oxide layer 46 on the die bottom surface 36. Accordingly, such embodiments may simply leave the bottom oxide layer 46 in those regions. Other embodiments, however, may remove the bottom oxide layer 46 from those regions.

The process concludes at step 608, which separates the die 16 from the wafer. Stated another way, step 608 singulates the wafer into a plurality of individual capped MEMS dies 12A using conventional processes. For example, step 608 may dice the wafer along prescribed scribe streets of the wafers forming the plurality of capped MEMS dice 12A discussed above.

Accordingly, illustrative embodiments form the sensor and second regions 32 and 34 so that they are substantially mechanically isolated, thus mitigating the risk of stress transmission to the sensitive microstructure 18. Trenches 30 exposed to the die bottom surface 36 permit this arrangement, and the membrane providing the hermeticity obviates the need for additional caps or other complex structure for that purpose.

These exposed trenches, however, may generally weaken dice that are not reinforced with other components, such as an additional cap bonded to the bottom side of the die 16. This is believed to initially lead one skilled in the art away from forming a capped MEMS die having such trenches. Acting against this conventional wisdom, however, the inventors experimented and recognized that the risk of die failure was overcome by the stress mitigation benefits.

Although the above discussion discloses various exemplary embodiments of the invention, it should be apparent that those skilled in the art can make various modifications that will achieve some of the advantages of the invention without departing from the true scope of the invention.

What is claimed is:

1. A hermetically sealed, stress tolerant MEMS device comprising:
    a substrate having a structure surface and an opposing exterior surface, wherein the substrate includes at least one stress isolation trench in a plane substantially parallel to the structure surface and that extends from the structure surface and is open to the opposing exterior surface, the at least one stress isolation trench forming and circumscribing in the substrate a sensor region and further defining a second region radially outward of the sensor region;
    at least one sealing structure on the structure surface of the substrate hermetically sealing the at least one stress isolation trench at the structure surface of the substrate;
    a sensor microstructure on or above the structure surface of the sensor region and circumscribed by the at least one stress isolation trench; and
    a cap coupled directly or indirectly with the substrate, the cap and the at least one sealing structure forming at least part of a hermetically sealed interior chamber containing the microstructure.

2. The MEMS device as defined by claim 1, wherein the cap couples with the second region of the substrate.

3. The MEMS device as defined by claim 1, further comprising at least one connection structure integral with the substrate, spanning the at least one stress isolation trench, and mechanically connecting the sensor region and the second region.

4. The MEMS device as defined by claim 3, wherein the at least one connection structure includes a serpentine spring.

5. The MEMS device as defined by claim 1, wherein:
the sensor region and the second region extend from the structure surface of the substrate to the opposing exterior surface of the substrate; and
the sensor region at the opposing exterior surface is recessed relative to the second region at the opposing exterior surface.

6. The MEMS device as defined by claim 5, wherein the substrate is a first substrate, and wherein the MEMS device further comprises a second substrate, wherein:
the second region of the MEMS device is in physical contact and secured with the second substrate;
the sensor region is spaced from the second substrate; and
the second substrate is a MEMS device package or a circuit board.

7. The MEMS device as defined by claim 1, wherein the sensor microstructure comprises an inertial sensor microstructure.

8. A hermetically sealed, stress tolerant MEMS device comprising:
a substrate having a structure surface and an opposing exterior surface, wherein the substrate includes at least one stress isolation trench in a plane substantially parallel to the structure surface and that extends from the structure surface and is open to the opposing exterior surface, the at least one stress isolation trench partitioning the substrate into a sensor region and a second region, wherein the at least one stress isolation trench circumscribes the sensor region and the second region is radially outward of the sensor region;
a membrane spanning the at least one stress isolation trench, the membrane hermetically sealing the at least one stress isolation trench at the structure surface of the substrate;
a sensor microstructure on or above the structure surface of the sensor region and circumscribed by the at least one stress isolation trench; and
a cap coupled directly or indirectly with the substrate, the cap and the membrane forming at least part of a hermetically sealed interior chamber containing the sensor microstructure.

9. The MEMS device as defined by claim 8, further comprising at least one connection structure integral with the substrate, spanning the at least one stress isolation trench, and mechanically connecting the sensor region and the second region.

10. The MEMS device as defined by claim 8, wherein:
the sensor region and the second region extend from the structure surface of the substrate to the opposing exterior surface of the substrate; and
the sensor region at the opposing exterior surface is recessed relative to the second region at the opposing exterior surface.

11. The MEMS device as defined by claim 10, wherein the substrate is a first substrate, and wherein the MEMS device further comprises a second substrate, wherein:
the second region of the MEMS device is in physical contact and secured with the second substrate;
the sensor region is spaced from the second substrate; and
the second substrate is a MEMS device package or a circuit board.

12. The MEMS device as defined by claim 8, wherein the cap couples with the second region of the substrate.

13. The MEMS device as defined by claim 8, wherein the sensor microstructure comprises an inertial sensor microstructure.

14. A method of producing a hermetically sealed, stress tolerant MEMS device, the method comprising:
forming, in a substrate having a structure surface and an opposing exterior surface, at least one stress isolation trench in a plane substantially parallel to the structure surface and that extends from the structure surface and is open to the opposing exterior surface, the at least one stress isolation trench forming and circumscribing in the substrate a sensor region and further defining a second region radially outward of the sensor region;
forming at least one sealing structure on the structure surface of the substrate;
forming a sensor microstructure on or above the sensor region and circumscribed by the at least one stress isolation trench; and
coupling a cap with the substrate,
wherein the at least one sealing structure hermetically seals the at least one stress isolation trench at the structure surface of the substrate, and wherein the cap and the at least one sealing structure form at least part of a hermetically sealed interior chamber containing the sensor microstructure.

15. The method as defined by claim 14, wherein forming the at least one stress isolation trench comprises forming at least one connection structure mechanically connecting the sensor region and the second region.

16. The method as defined by claim 14, wherein forming the at least one stress isolation trench comprises etching the substrate from the opposing exterior surface using an etchant, and using the at least one sealing structure as an etch stop.

17. The method as defined by claim 14, wherein:
the sensor region and the second region extend from the structure surface of the substrate to the opposing exterior surface of the substrate; and
the method further comprises etching the sensor region at the opposing exterior surface so that it is recessed relative to the second region at the opposing exterior surface.

18. The method as defined by claim 17, wherein the substrate is a first substrate and wherein the method further comprises bonding the opposing exterior surface of the second region directly or indirectly to a second substrate comprising a MEMS device package or a circuit board.

19. The MEMS device as defined by claim 1, wherein the at least one sealing structure comprises a membrane spanning the at least one stress isolation trench, the membrane hermetically sealing the at least one stress isolation trench at the structure surface of the substrate.

20. The method as defined by claim 14, wherein forming the at least one sealing structure comprises forming a membrane spanning the at least one stress isolation trench, the membrane hermetically sealing the at least one stress isolation trench at the structure surface of the substrate.

* * * * *